US012717177B2

(12) United States Patent
Kippenberg et al.

(10) Patent No.: US 12,717,177 B2
(45) Date of Patent: Aug. 25, 2026

(54) ELECTRICALLY TUNABLE OPTICAL RESONATOR ON A CHIP FOR FAST TUNABLE INTEGRATED LASERS

(71) Applicants: ECOLE POLYTECHNIQUE FEDERALE DE LAUSANNE (EPFL), Lausanne (CH); PURDUE RESEARCH FOUNDATION, West Lafayette, IN (US)

(72) Inventors: Tobias Kippenberg, Aran (CH); Sunil Bhave, West Lafayette, IN (US); Hao Tian, West Lafayette, IN (US); Johann Riemensberger, St-Sulpice VD (CH); Grigorii Likhachev, Chavannes-Renens (CH); Anat Siddharth, Prilly (CH)

(73) Assignees: Ecole Polytechnique Federale De Lausanne (EPFL), Lausanne (CH); Purdue Research Foundation, West Lafayette, IN (US)

( * ) Notice: Subject to any disclaimer, the term of this patent is extended or adjusted under 35 U.S.C. 154(b) by 437 days.

(21) Appl. No.: 18/550,081

(22) PCT Filed: Mar. 12, 2021

(86) PCT No.: PCT/EP2021/056338
§ 371 (c)(1),
(2) Date: Sep. 11, 2023

(87) PCT Pub. No.: WO2022/188990
PCT Pub. Date: Sep. 15, 2022

(65) Prior Publication Data
US 2024/0302682 A1 Sep. 12, 2024

(51) Int. Cl.
*G02F 1/01* (2006.01)
*G02F 1/225* (2006.01)
(Continued)

(52) U.S. Cl.
CPC ............ *G02F 1/0128* (2013.01); *G02F 1/225* (2013.01); *G02F 1/3511* (2013.01); *G02F 1/354* (2021.01);
(Continued)

(58) Field of Classification Search
CPC ...... G02F 1/0128; G02F 1/225; G02F 1/3511; G02F 1/354; G02F 2203/15; H01S 5/0092; H01S 5/0656; H01S 5/4006
See application file for complete search history.

(56) References Cited

U.S. PATENT DOCUMENTS 9,571,063 B2 2/2017 Burak et al.
11,467,262 B2 * 10/2022 Levy .................. H01S 5/06206
(Continued)

FOREIGN PATENT DOCUMENTS

EP 3764489 A1 1/2021

OTHER PUBLICATIONS

Jean Armstrong, “OFDM for Optical Communications,” Journal of Lightwave Technology 27, 189-204 (2009).
(Continued)

*Primary Examiner* — Daniel Petkovsek
(74) *Attorney, Agent, or Firm* — Andrus Intellectual Property Law, LLP

(57) ABSTRACT

The present invention relates to an electrically tunable photonic resonator device for a component having a fast and flat actuation response. The photonic resonator device includes at least one optical waveguide with an optical interface for coupling in laser light. The photonic resonator device includes at least one optical resonator including a waveguide made of an optical resonator material. A laser light coupled via the optical waveguide is coupled into at least one optical resonator. The photonic resonator device includes at least one piezo actuator to apply mechanical
(Continued)

stress onto the optical resonator. The optical resonator, the piezo actuator, and the optical waveguide are monolithically integrated on a common substrate of the photonic resonator device. The photonic resonator device includes a mechanical mode suppression means configured to attenuate one or more mechanical modes of oscillation caused by an AC operation of the piezo actuator.

22 Claims, 9 Drawing Sheets

(51) Int. Cl.
*G02F 1/35* (2006.01)
*H01S 5/065* (2006.01)
*H01S 5/40* (2006.01)
*H01S 5/00* (2006.01)

(52) U.S. Cl.
CPC .......... *H01S 5/0656* (2013.01); *H01S 5/4006* (2013.01); *G02F 2203/15* (2013.01); *H01S 5/0092* (2013.01)

(56) References Cited

U.S. PATENT DOCUMENTS

2019/0181611 A1* 6/2019 Maleki .............. H01S 3/094076
2022/0006260 A1* 1/2022 Lipson ................ H01S 5/06821

OTHER PUBLICATIONS

H. Bostick, "A Carbon Dioxide Laser Radar System," IEEE Journal of Quantum Electronics 3, 232-232 (1967).
Alan Rogers, "Distributed Optical-Fibre Sensing," Measurement Science and Technology 10, R75 (1999).
RI MacDonald, "Frequency Domain Optical Reflectometer," Applied Optics 20, 1840-1844 (1981).
Deepak Uttam and B Culshaw, "Precision Time Domain Reflectometry in Optical Fiber Systems Using a Frequency Modulated Continuous Wave Ranging Technique," Journal of Lightwave Technology 3, 971-977 (1985).
Christoforos Kachris et al., "A Survey on Optical Interconnects for Data Centers," IEEE Communications Surveys & Tutorials 14, 1021-1036 (2012).
Elijah Dale et al., "Ultra-Narrow Line Tunable Semiconductor Lasers for Coherent Lidar Applications," in Imaging Systems and Applications (Optical Society of America, 2014) pp. JTu2C-3.
David Marpaung, Jianping Yao, and José Capmany, "Integrated Microwave Photonics," Nature Photonics 13, 80-90 (2019).
Guang-Hua Duan et al., "Hybrid III-V on Silicon Lasers for Photonic Integrated Circuits on Silicon," IEEE Journal of selected topics in quantum electronics 20, 158-170 (2014).
David Thomson et al., "Roadmap on Silicon Photonics," Journal of Optics 18, 073003 (2016).
Charles Henry, "Theory of the Linewidth of Semiconductor Lasers," IEEE Journal of Quantum Electronics 18, 259-264 (1982).
Pablo Marin-Palomo et al., "Microresonator-Based Solitons for Massively Parallel Coherent Optical Communications," Nature 546, 274-279 (2017).
Guy Millot et al., "Frequency-Agile Dual-Comb Spectroscopy," Nature Photonics 10, 27-30 (2016).
P Feneyrou et al., "Novel Development for Fmcw Lidar," in Applications of Lasers for Sensing and Free Space Communications (Optical Society of America, 2018) pp. SM3H-2.
Hairun Guo et al., "Universal Dynamics and Deterministic Switching of Dissipative Kerr Solitons in Optical Microresonators," Nature Physics (2016).
Junqiu Liu et al., "Photonic Microwave Generation in the X- and K-Band Using Integrated Soliton Microcombs," Nature Photonics (2020).
International Search Report for PCT Application No. PCT/EP2021/056338, mailed Nov. 29, 2021.
Tian, H., Liu, J., Dong, B et al., "Hybrid Integrated Photonics Using Bulk Acoustic Resonators," Nat. Commun. 11, 3073 (2020). https://doi.org/10.1038/s41467-020-16812-6.
Liu, J., Tian, H., Lucas, E et al., "Monolithic Piezoelectric Control of Soliton Microcombs," Nature 583, 385-390 (2020); https://doi.org/10.1038/s41586-020-2465-8.
Ezra Ip et al., "Feedforward Carrier Recovery for Coherent Optical Communications," Journal of Lightwave Technology 25, 2675-2692 (2007).
Minh A Tran, Duanni Huang, and John E Bowers, "Tutorial on Narrow Linewidth Tunable Semiconductor Lasers Using Si/Iii-V Heterogeneous Integration," APL photonics 4, 111101 (2019).
Klaus-J Boller et al., "Hybrid Integrated Semiconductor Lasers With Silicon Nitride Feedback Circuits," in Photonics, vol. 7 (Multidisciplinary Digital Publishing Institute, 2020) p. 4.
Xiaopeng Xie et al., "Phase Noise Characterisation of Sub-Hertz Linewidth Lasers via Digital Cross Correlation," Optics Letters 42, 1217-1220 (2017).
Jeff Hecht, "Lidar for Self-Driving Cars," Optics and Photonics News 29, 26-33 (2018).
Tin Komljenovic et al., "Heterogeneous Silicon Photonic Integrated Circuits," Journal of Lightwave Technology 34, 20-35 (2016).
Arthur L Schawlow and Charles H Townes, "Infrared and Optical Masers," Physical Review 112, 1940 (1958).
Tobias Herr et al., "Temporal Solitons in Optical Microresonators," Nature Photonics 8, 145 (2014).
W Liang et al., "Ultralow Noise Miniature External Cavity Semiconductor Laser," Nature communications 6, 1-6 (2015).
Anatoliy A Savchenkov et al., "Application of a Self-Injection Locked Cyan Laser for Barium lon Cooling and Spectroscopy," Scientific Reports 10, 1-7 (2020).
Brian Stern, Xingchen Ji, Avik Dutt, and Michal Lipson, "Compact Narrow-Linewidth Integrated Laser Based on a Low-Loss Silicon Nitride Ring Resonator," Optics letters 42, 4541-4544 (2017).
Duanni Huang et al., "High-Power Sub-Khz Linewidth Lasers Fully Integrated on Silicon," Optica 6, 745-752 (2019).
Youwen Fan et al., "Hybrid Integrated Inp-Si 3 N 4 Diode Laser With a 40-Hz Intrinsic Linewidth," Optics express 28, 21713-21728 (2020).
Gar-Wing Truong et al., "Accurate Frequency Referencing for Fieldable Dual-Comb Spectroscopy," Optics express 24, 30495-30504 (2016).
I Debecker et al., "High-Speed Cavity Ringdown Spectroscopy With Increased Spectral Resolution by Simultaneous Laser and Cavity Tuning," Optics express 13, 2906-2915 (2005).
Martin HP Pfeiffer et al., "Photonic Damascene Process for Integrated High-Q Microresonator Based Nonlinear Photonics," Optica 3, 20-25 (2016).
Junqiu Liu et al., "Ultralow-Power Chip-Based Soliton Microcombs for Photonic Integration," Optica 5, 1347-1353 (2018).
NM Kondratiev et al., "Self-Injection Locking of a Laser Diode to a High-Q WGM Microresonator," Optics Express 25, 28167-28178 (2017).

* cited by examiner

Linear
CW laser
Frequency
PSD
1
2
23
25
100µm
$Si_3N_4$ photonic chip
5
AlN
Mo
Al
21
22
32
3
31
DFB Laser
Locked
Unlocked
Frequency
PSD
(a)

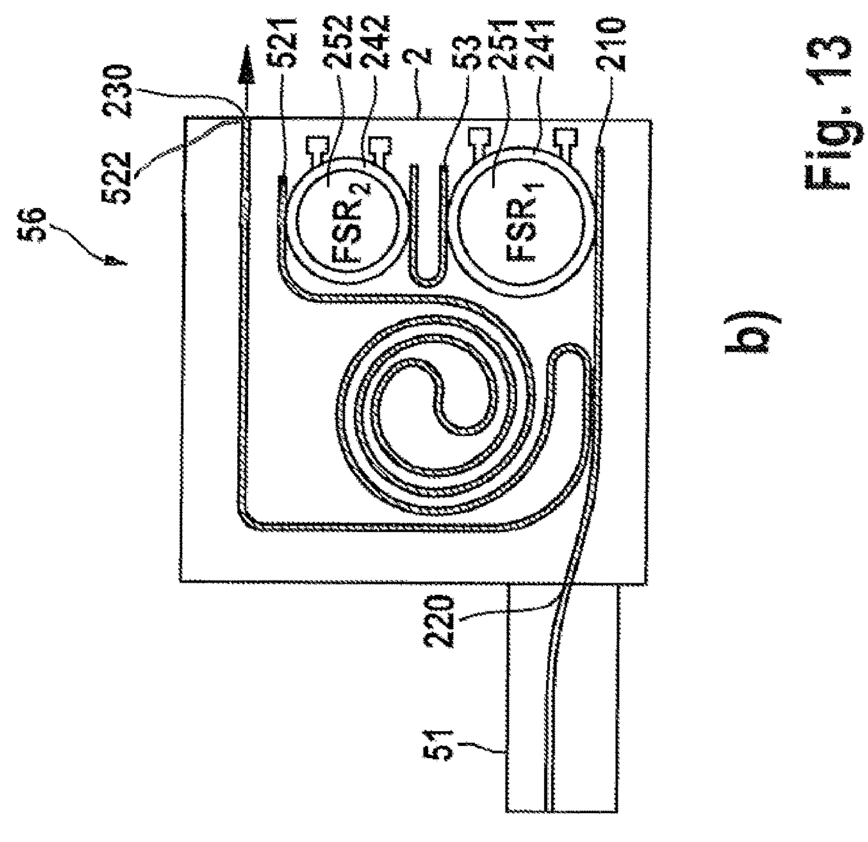
Fig. 13
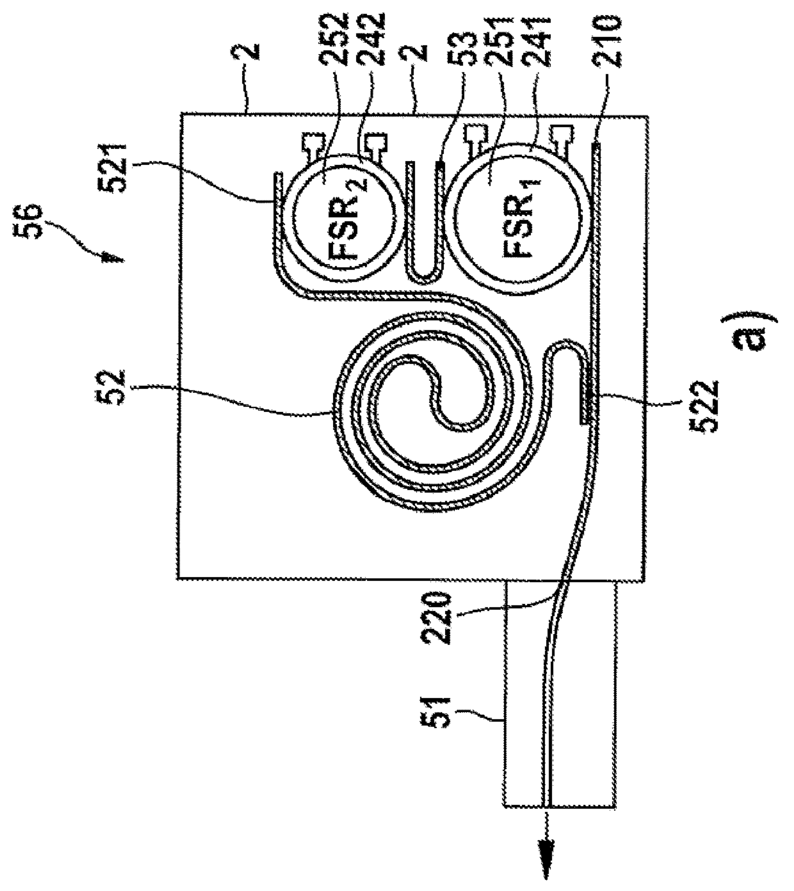

ELECTRICALLY TUNABLE OPTICAL RESONATOR ON A CHIP FOR FAST TUNABLE INTEGRATED LASERS

CROSS-REFERENCE TO RELATED APPLICATIONS

This application is the U.S. national stage application of International Application No. PCT/EP2021/056338, filed on Mar. 12, 2021, which international application was published on Sep. 15, 2022, as International Publication WO 2022/188990 A1 in the English language. The international application is incorporated herein by reference, in its entirety.

TECHNICAL FIELD

The present invention relates to photonic resonators, particularly photonic resonators with a stress-optical actuation in a monolithic integration.

TECHNICAL BACKGROUND

Lasers are imperative in a wide range of technological and scientific applications, ranging from distributed fibre sensing, coherent LiDAR, high spectral efficiency coherent communication, or microwave photonics. Requirements for these applications are low phase noise and high-frequency agility. Frequency agility is a key requirement, e.g., to lock lasers to fibre gratings, adjust the phase in carrier recovery, or achieve tight phase locking.

Over the past decade, the development of heterogeneously integrated lasers has led to a new class of CMOS compatible highly integrated lasers sources, that are now commercially employed in data-center interconnects. Fundamentally, the linewidth, that is phase noise, of lasers is given by the Schawlow-Townes linewidth limit, which dictates that low-loss laser cavities allow inherently low phase noise. To date, the lowest laser phase noise of compact semiconductor lasers is achieved by self-injection-locking with discrete crystalline resonators or gain chips coupled to low-loss photonic lightwave circuits, that have very limited frequency agility.

The main difficulty in achieving high agility lies in rapid frequency tuning of the resonator/cavity that provides laser linewidth narrowing effect while maintaining a long photon lifetime in the resonator/cavity.

Increasingly, process technologies, such as silicon nitride ($Si_3N_4$) on Silicon, are more and more available which allows monolithic integration of photonic components in a single device. This enables a batch production of integrated photonic devices e.g. for laser devices with the lowest phase noises.

However, integrated photonic devices often suffer from a low-frequency tunability thus resulting in a lack of frequency agility. Conventionally, e.g. as known from Warren Jin et al, "Piezoelectrically tuned silicon nitride ring resonator", Optics EXPRESS Vol. 26, No 3, Feb. 5, 2018, a $Si_3N_4$ ring resonator is known which is tuned by geometric deformation using a piezoelectric actuator. Here, a photonic ring resonator and piezoelectric elements are monolithically integrated on a silicon substrate which allows an ultra-low-power tuning across a full FSR in a low confinement silicon nitride-based ring resonator structure.

From document Hao Tian et al, "Hybrid integrated photonics using bulk acoustic resonators", Nature Communications, 2020, discloses integrated photonic devices based on $Si_3N_4$ waveguides. Microwave frequency acousto-optic modulation is employed by exciting high overtone bulk acoustic wave resonances in the photonic stack. The actuation is performed by means of an AlN piezoelectric actuator placed directly on top of the $Si_3N_4$ microring resonator.

By the present specification, reference is specifically made to the following prior art illustrating the technical background of the invention:

Jean Armstrong, "OFDM for optical communications," Journal of lightwave technology 27, 189-204 (2009)

H Bostick, "A carbon dioxide laser radar system," IEEE Journal of Quantum Electronics 3, 232-232 (1967).

Alan Rogers, "Distributed optical-fibre sensing," Measurement Science and Technology 10, R75 (1999).

Ezra Ip et al., "Feedforward carrier recovery for coherent optical communications," Journal of Lightwave Technology 25, 2675-2692 (2007).

RI MacDonald, "Frequency domain optical reflectometer, " Applied Optics 20, 1840-1844 (1981).

Deepak Uttam and B Culshaw, "Precision time domain reflectometry in optical fiber systems using a frequency modulated continuous wave ranging technique," Journal of Lightwave Technology 3, 971-977 (1985).

Christoforos Kachris et al., "A survey on optical interconnects for data centers," IEEE Communications Surveys & Tutorials 14, 1021-1036 (2012).

Minh A Tran, Duanni Huang, and John E Bowers, "Tutorial on narrow linewidth tunable semiconductor lasers using si/iii-v heterogeneous integration," APL photonics 4, 111101 (2019).

Klaus-J Boller et al., "Hybrid integrated semiconductor lasers with silicon nitride feedback circuits," in Photonics, Vol. 7 (Multidisciplinary Digital Publishing Institute, 2020) p. 4.

Elijah Dale et al., "Ultra-narrow line tunable semiconductor lasers for coherent lidar applications," in Imaging Systems and Applications (Optical Society of America, 2014) pp. JTu2C-3.

Jeff Hecht, "Lidar for self-driving cars," Optics and Photonics News 29, 26-33 (2018).

David Marpaung, Jianping Yao, and José Capmany, "Integrated microwave photonics," Nature photonics 13, 80-90 (2019).

Guang-Hua Duan et al., "Hybrid iii-v on silicon lasers for photonic integrated circuits on silicon," IEEE Journal of selected topics in quantum electronics 20, 158-170 (2014).

Tin Komljenovic et al., "Heterogeneous silicon photonic integrated circuits," Journal of Lightwave Technology 34, 20-35 (2016).

David Thomson et al., "Roadmap on silicon photonics," Journal of Optics 18, 073003 (2016).

Arthur L Schawlow and Charles H Townes, "Infrared and optical masers," Physical Review 112, 1940 (1958).

Charles Henry, "Theory of the linewidth of semiconductor lasers," IEEE Journal of Quantum Electronics 18, 259-264 (1982).

W Liang et al., "Ultralow noise miniature external cavity semiconductor laser," Nature communications 6, 1-6 (2015).

Anatoliy A Savchenkov et al., "Application of a self-injection locked cyan laser for barium ion cooling and spectroscopy," Scientific Reports 10, 1-7 (2020).

Brian Stern, Xingchen Ji, Avik Dutt, and Michal Lipson, "Compact narrow-linewidth integrated laser based on a low-loss silicon nitride ring resonator," Optics letters 42, 4541-4544 (2017).

Duanni Huang et al., "High-power sub-khz linewidth lasers fully integrated on silicon," Optica 6, 745-752 (2019).
Youwen Fan et al., "Hybrid integrated inp-si 3 n 4 diode laser with a 40-hz intrinsic linewidth," Optics express 28, 21713-21728 (2020).
Pablo Marin-Palomo et al., "Microresonator-based solitons for massively parallel coherent optical communications," Nature 546, 274-279 (2017).
Gar-Wing Truong et al., "Accurate frequency referencing for fieldable dual-comb spectroscopy," Optics express 24, 30495-30504 (2016).
Guy Millot et al., "Frequency-agile dual-comb spectroscopy," Nature Photonics 10, 27-30 (2016).
I Debecker et al., "High-speed cavity ringdown spectroscopy with increased spectral resolution by simultaneous laser and cavity tuning," Optics express 13, 2906-2915 (2005).
Junqiu Liu et al., "Monolithic piezoelectric control of soliton microcombs," Nature 583, 385-390 (2020).
Martin H P Pfeiffer et al., "Photonic damascene process for integrated high-q microresonator based nonlinear photonics," Optica 3, 20-25 (2016).
Junqiu Liu et al., "Ultralow-power chip-based soliton microcombs for photonic integration," Optica 5, 1347-1353 (2018).
Hao Tian et al., "Hybrid integrated photonics using bulk acoustic resonators," Nature communications 11, 1-8 (2020).
NM Kondratiev et al., "Self-injection locking of a laser diode to a high-q wgm microresonator," Optics Express 25, 28167-28178 (2017).
Xiaopeng Xie et al., "Phase noise characterisation of sub-hertz linewidth lasers via digital cross correlation," Optics Letters 42, 1217-1220 (2017).
P Feneyrou et al., "Novel development for fmcw lidar," in Applications of Lasers for Sensing and Free Space Communications (Optical Society of America, 2018) pp. SM3H-2.
Tobias Herr et al., "Temporal solitons in optical microresonators," Nature Photonics 8, 145 (2014).
Hairun Guo et al., "Universal dynamics and deterministic switching of dissipative kerr solitons in optical microresonators," Nature Physics (2016).
Junqiu Liu et al., "Photonic microwave generation in the x- and k-band using integrated soliton microcombs," Nature Photonics (2020).
Dariusz Burak et al., "Acoustic resonator device with structures having different apodized shapes," (2017), U.S. Pat. No. 9,571,063.

One main difficulty in achieving high agility lies in rapid frequency tuning of the resonator that provides a laser linewidth narrowing effect while maintaining a long photon lifetime in the resonator.

It is an object of the present invention to provide an integrated photonic resonator with a piezo-based optical tuning which allows a high tuning bandwidth for frequency modulation by applying a stress-optical effect while further providing low noise applications.

SUMMARY OF THE INVENTION

These objectives have been resolved with an integrated photonic resonator device according to claim 1 and an optical device for a laser component according to the further independent claim.

Preferred embodiments are indicated in the depending subclaims.

According to a first aspect, a photonic resonator device for a laser component is provided, comprising:

- an optical waveguide with an optical interface for coupling in laser light,
- at least one optical resonator including a waveguide being made of an optical resonator material, particularly $Si_3N_4$, wherein laser light coupled via the optical waveguide is coupled into the at least one optical resonator,
- at least one piezo actuator to apply mechanical stress at least partially onto the at least one optical resonator; wherein the at least one optical resonator, the at least one piezo actuator and the optical waveguide are monolithically integrated on a common substrate of the photonic resonator device;
- a mechanical mode suppression means configured to attenuate one or more mechanical modes of oscillation caused by an AC operation of the at least one piezo actuator.

The above photonic resonator may provide a compact integrated device that can be used in integrated lasers for different applications such as FMCW LiDAR or microwave photonics.

The above photonic resonator device is formed as a compact dielectric resonator having a cm or sub-cm scale optical path length. The photonic resonator may comprise a circular resonator like a ring or loop resonator, a Fabry-Perot resonator (linear resonator) or the like.

The resonator is coupled with a piezo actuator so as to apply mechanical stress onto the dielectric resonator to achieve a geometric deformation. The geometric deformation-induced changes an effective path of the resonator thereby allowing the resonator to be tuned by controlling the piezo actuator.

Particularly, the photonic resonator device includes a mechanical mode suppression means which allows to passively or actively attenuate one or more mechanical (contour) modes of oscillation applied on the photonic resonator device caused by the tuning operation of the piezo actuator. The mechanical modes of the integrated photonic resonator device are defined by its in-plane dimensions. This is particularly problematic as the photonic resonator device is integrated on the common substrate. Due to the minimized dimensions, the higher frequency operation of the piezo actuator may cause mechanical oscillations of the common substrate due to resonances.

For tuning the optical resonances of the photonic resonator device, AC operation of the piezo actuator is initiated. The AC operation can be triangular or sawtooth depending on the application. For e.g. a triangular signal may be used for LiDAR applications and sawtooth can be used for continuous tuning of Vernier-based laser. This induces mechanical modes that shall be suppressed so that the actuation response is flattened, and the chirp non-linearity can be minimized. When used in an FMCW LIDAR component the flattened actuation transfer function allows minimizing chirping non-linearity.

Basically, a flattened actuation response is beneficial to applications where a tight frequency locking is required. For example, FMCW LiDAR applications require highly linear chirp optical signals with high spectral purity and a large chirping range. It can be achieved by the tuning of the piezo actuator over a wide frequency range.

It may be provided that the photonic resonator device is formed by a MEMS process including the following process steps:

Providing a silicon substrate with a top layer of silicon dioxide:

Forming optical structures of the optical resonator using selective etching and/or deposition of the optical resonator material;

Depositing silicon dioxide to bury the optical structures;

Applying a piezo material to form the piezo actuator onto at least a part of the optical structures of the optical resonator.

The optical resonator material and/or the piezo material may be thin-film-deposited onto the substrate.

Furthermore, the above MEMS process may be applied on a wafer-scale thereby contributing to batch processing.

According to an embodiment, the optical resonator may be a circular resonator, such as a loop resonator, a ring resonator, a racetrack resonator, or any resonator with a closed-circuit the waveguide of which surrounds an inner resonator plane, wherein the waveguide of the optical resonator is coupled to the optical waveguide in a coupling region, wherein the piezo actuator covers or excludes the coupling region.

Particularly, the piezo actuator may have an inner piezo actuator structure which is planar on the surface of the photonic resonator device and arranged to cover at least 90% of the inner resonator plane.

It may be provided that the outer edge of the planar inner piezo actuator structure is one of:

Fully in the interior of the inner resonator plane;

partly covers the waveguide of the optical resonator; and outside of the inner resonator plane, so as to overlap the waveguide of the optical resonator.

Moreover, the piezo actuator may have an outer piezo actuator structure which at least partly surrounds the waveguide of the optical resonator wherein the outer piezo actuator structure one of:

has an inner edge being in the interior of the inner resonator plane;

covers the waveguide of the optical circulator, and has an inner edge being outside of the inner resonator plane.

Alternatively, the piezo actuator may have both an inner piezo actuator structure and an outer piezo actuator structure being distanced by a gap, wherein the gap one of:

is in the interior of the inner resonator plane, at least partly covers the waveguide of the optical resonator; and outside of the inner resonator plane.

According to an embodiment, the piezo actuator may be formed with a lower electrode layer, particularly made of Al or Mo, a piezo material layer, particularly formed of AlN, Sr doped AlN, or PZT, and an upper electrode layer particularly formed of Al or Mo.

Furthermore, the optical resonator may be made of a resonator material, which has a third-order (Kerr) nonlinearity and an anomalous or normal resonator dispersion.

According to the invention, the mechanical mode suppression means includes at least one dummy piezo actuator arranged on the substrate of the photonic resonator device laterally displaced to the piezo actuator.

The piezo actuator and the dummy piezo actuator may also be arranged each with the inner piezo actuator structure and the outer piezo actuator structure being distanced by a gap, as mentioned above, for a push-pull configuration. This arrangement can be differentially driven to cancel flexural modes.

Particularly, the at least one dummy piezo actuator may have an identical shape and/or size and/or orientation as the piezo actuator.

It may be provided that the at least one dummy piezo actuator arranged on the common substrate has a lateral displacement to the piezo actuator in a direction of one of the lateral edges of the common substrate.

Alternatively or additionally, the mechanical mode suppression means may include an apodization of the common substrate, wherein the common substrate has at least two edges which are non-parallel to each other, wherein particularly the common substrate has no parallel edges and/or is polygon-shaped and/or has edges with different lengths. Particularly, the common substrate can be shaped as an irregular polygon to have non-parallel sides.

Moreover, the mechanical mode suppression means may include sizing of the common substrate so that a first eigenfrequency of the flexural modes is above 0.5 to 5 MHz and the first eigenfrequency of the bulk modes is above 2 to 10 MHz.

According to an embodiment, the mechanical mode suppression means may include providing one or more additional structures on the common substrate which provide a mechanical oscillation attenuation of bulk and/or flexural and/or HBAR modes (HBAR: High-Overtone Bulk Acoustic Resonator).

Particularly, the one or more additional structures may comprise at least one corrugation on a backside of the common substrate.

Furthermore, the common substrate may be thinned to a thickness of less than 300 μm. Preferably, substrate thicknesses of 50 μm to 250 μm may be provided.

Particularly, the additional structures of the mechanical mode suppression means may include one or more recessions on one surface of the common substrate and/or one or more elevations on one surface of the common substrate.

A tuning unit may be provided on the common substrate or separate thereof, wherein the tuning unit is configured to drive the piezo actuator and the dummy piezo actuator in an out of phase manner, particularly in counter phase.

According to a further aspect a laser component is provided, comprising a laser device being arranged for providing laser light and the above photonic resonator device, wherein the laser device is coupled with the optical waveguide of the photonic resonator device to allow laser light being transmitted between the laser device and the photonic resonator device to enable a self-injection-locking operation of the laser component.

A tuning unit may be configured to provide a variable driving current for the laser device and a variable actuator driving AC voltage for the piezo actuator to allow tuning of the laser component.

According to a further aspect a photonic resonator device formed as a Vernier filter device is provided, comprising:

at least one optical waveguide with an optical interface for coupling in laser light, a first optical resonator including a waveguide being made of an optical resonator material, particularly $Si_3N_4$, wherein laser light coupled via the at least one optical waveguide is coupled into the first optical resonator, a second optical resonator including a waveguide being made of an optical resonator material, particularly $Si_3N_4$, wherein the first and second optical resonators are optically coupled via a waveguide portion, wherein the first and the second optical resonator have different free spectral ranges;

a first and second piezo actuator to apply mechanical stress at least partially onto the first and second optical resonators;

a delay waveguide optically coupling the waveguide with the second optical resonator;

wherein the first and second optical resonators, the first and second piezo actuator and the at least one optical waveguide and the delay waveguide are monolithically integrated on a common substrate of the photonic resonator device;

a mechanical mode suppression means configured to attenuate one or more mechanical modes of oscillation caused by an AC operation of the at least one piezo actuator.

BRIEF DESCRIPTION OF THE DRAWINGS

Embodiments are described in more detail in conjunction with the accompanying drawings in which:

FIGS. 13*a* and *b* schematically shows configurations of a Vernier filter using the optical resonator.

DETAILED DESCRIPTION OF EMBODIMENTS

Preferred embodiments of the invention are described in the following based on an FMCW laser device using a photonic ring oscillator with a piezo actuator and with different kinds of mechanical mode suppression means.

Figure 1:
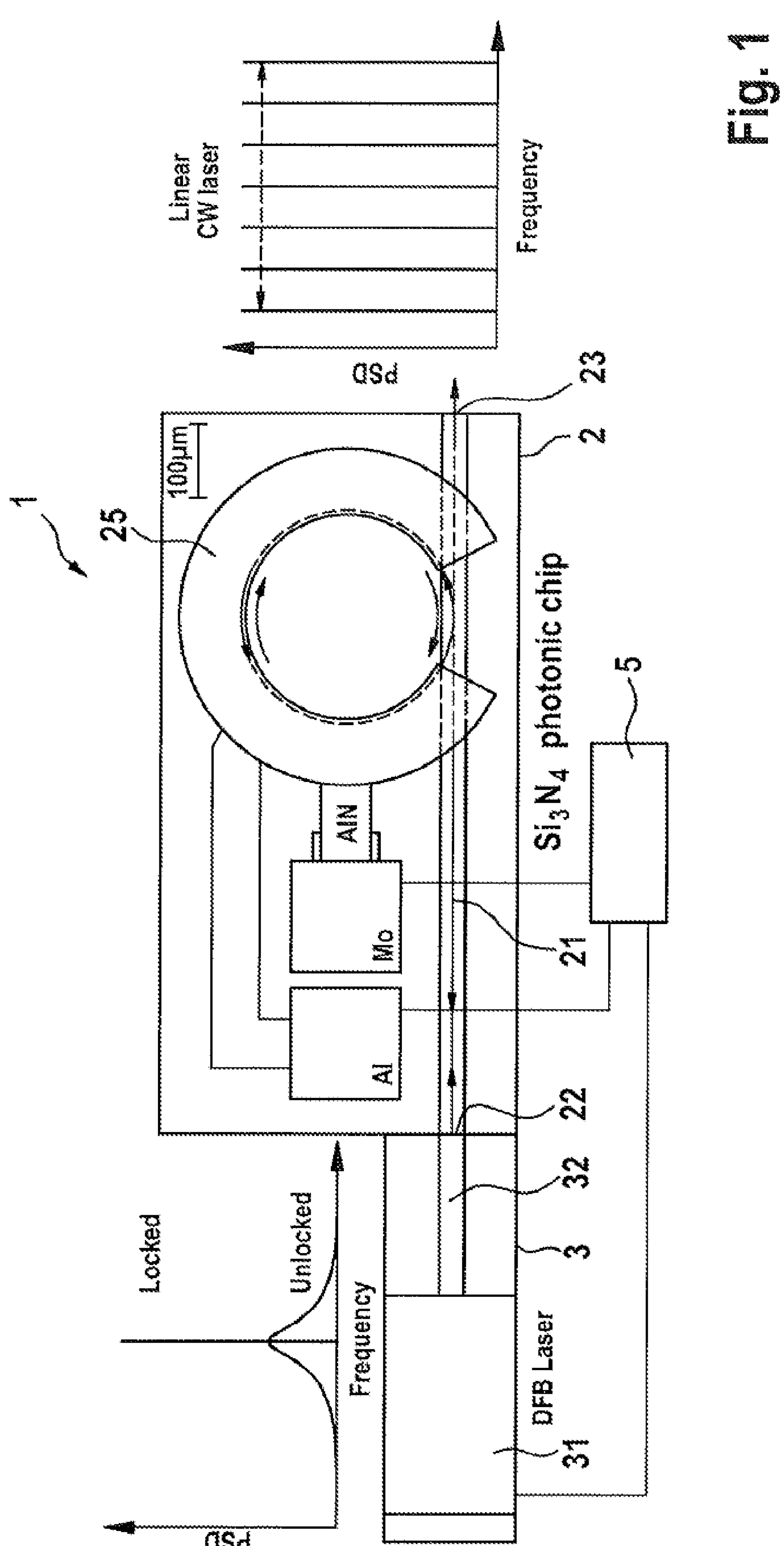
FIG. 1 shows a schematic diagram of laser component including a DFB laser and photonic resonator device.

FIG. 1 shows a laser component 1 using a monolithically integrated photonic resonator device 2 optically coupled with a DFB laser 3 (laser device) to form a heterogeneous component. The laser component 1 may be operated via laser self-injection locking so that based on the DFB laser power the operation scheme can transit from the single CW laser regime (i.e. linear self-injection locking) to the soliton microcomb formation regime.

The DFB laser 3 comprises a DFB laser light source 31 with an optical waveguide 32 being optically coupled to the photonic resonator device 2. The coupling of laser light may be via a side edge of the photonic resonator device 2. The laser light source 31 may be controlled by a control device 5 for adjusting the output frequency and output power of the DFB laser light source 31.

The DFB laser 3 device may comprise a chip-based semiconductor laser. The optical waveguide 32 may be a linear waveguide with an end being optically coupled with the output of the semiconductor laser. The optical waveguide 32 may be made of $Si_3N_4$ or $SiO_2$ or the like.

The photonic resonator device 2 is monolithically integrated and formed on a single substrate. The substrate is preferably made of Si or $SiO_2$, but other materials can be applied as well.

Figure 2:
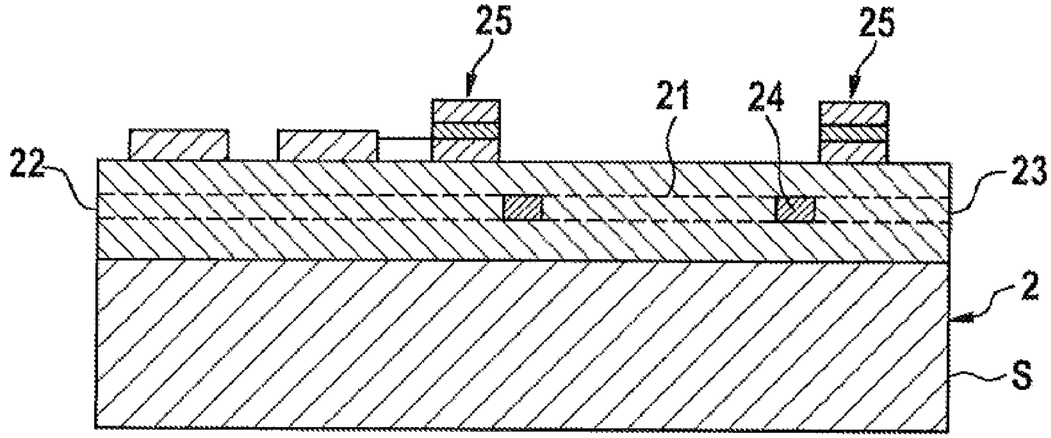
FIG. 2 shows a cross-sectional view of the photonic resonator device 2.

FIG. 2 additionally shows a cross-sectional view of the photonic resonator device 2.

The photonic resonator device 2 includes a common substrate S on which a waveguide 21 with a first and a second optical interface 22,23 on a lateral side of the substrate S the photonic resonator device 2 is arranged. The optical interfaces 22, 23 can be on opposite sides for a straight waveguide 21 or on the same side in case waveguide 21 is U-shaped.

The substrate S of the photonic resonator device 2 may have dimensions of about 1 mm×1 mm to 3 mm×3 mm, preferable around 2 mm×2 mm.

For laser component 1 the optical waveguide 32 of the DFB laser 3 is coupled with the first optical interface 22 so as to inject laser light emitted by the DFB laser 3 into the photonic resonator device 2 and to guide laser light back into the DFB laser 3 to enable self-injection locking operation.

A circular resonator 24 (optical resonator) is optically coupled with waveguide 21. The circular resonator 24 is exemplarily shaped as a photonic ring resonator formed with $Si_3N_4$ in a $SiO_2$ layer. Such a ring resonator waveguide structure may have a diameter of around 150 to 300 μm and an optical path length (circumference) of between 400 μm to 650 μm. The circular resonator 24 can also have other configurations which may defer from a ring shape such as an elliptically shaped resonator or other loop structures. Also spirally shaped structures are possible with optical path lengths of 30 μm to 1 μm are possible.

The optical waveguide 21 and the circular resonator 24 serves for guiding laser light emitted by the DFB laser 3 and are embedded in the $SiO_2$ layer while on the surface of the $SiO_2$ layer a planar piezo actuator 25 is arranged in proximity to at least a part of the circular resonator 24. Basically, the piezo actuator 25 serves to allow a stress-optical tuning by providing a geometric deformation of the circular resonator 24 to tune its optical properties. In general, the circular resonator 24 may be made of a resonator material which has a third order (Kerr) non-linearity and an anomalous resonator dispersion. Using a dielectric material such as $Si_3N_4$ a high resonator quality $Q_0>1\times10^7$ can be achieved.

As shown in FIGS. 3*a* to 3*f* the integrated photonic resonator device 2 can be manufactured using a CMOS process.

Figure 3:
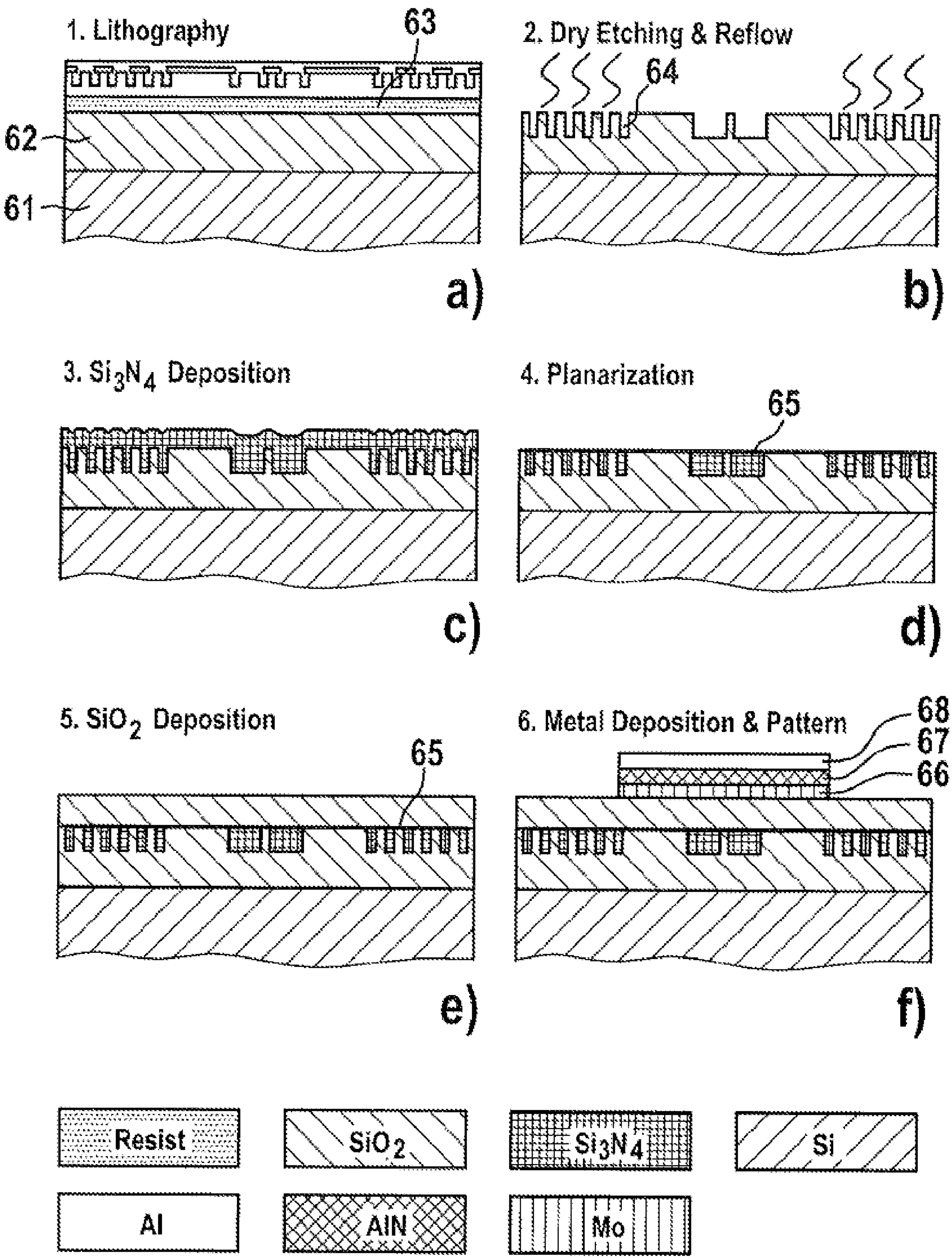
FIGS. 3*a* to 3*f* show a manufacturing process of the integrated photonic resonator device using a CMOS process.

Process steps are illustrated in FIGS. 3*a* to 3*f* starting with the substrate 61 made of silicon with a top layer 62 of $SiO_2$. By applying a patterning process using a photoresist 63 and lithography, regions can be selected for forming recessions 64 in the top layer 62. The recessions 64 as shown in FIG. 3*b* are formed by a dry etching and reflow process.

As shown in FIG. 3*c* the recessions 64 are filled with $Si_3N_4$ or another optical/dielectric active material 65 suitable as a material for the waveguide 21 and/or the circular resonator 24.

After deposition of the active material the surface is planarized according to FIG. 3*d* and $SiO_2$ is deposited onto the surface of the structures on the substrate 61, as shown in FIG. 5*e*. So, the dielectric/photonic structures are buried in a $SiO_2$ layer.

On top of the so formed photonic resonator, a vertical stack of a piezo actuator is applied. This stack can be formed by a lower electrode layer 66 of e.g., metal, such as Al or Mo, a second layer 67 of a piezo material, such as AlN or PZT, and an upper electrode layer 68 of e.g., a metal such as Al or Mo.

The so formed photonic resonator device allows forming an extra-thin piezo actuator. This allows operating the piezo actuator with a very high frequency of up to several MHz. For instance, the thickness of the second layer 67 of piezo material may be about 50 nm to 1500 nm, preferably between 800 and 1200 nm.

Activation of the so formed piezo actuator 25 allows applying mechanical stress onto the substrate and on the structures of the circular resonator 24 which results in geometric deformations.

Figure 4A:
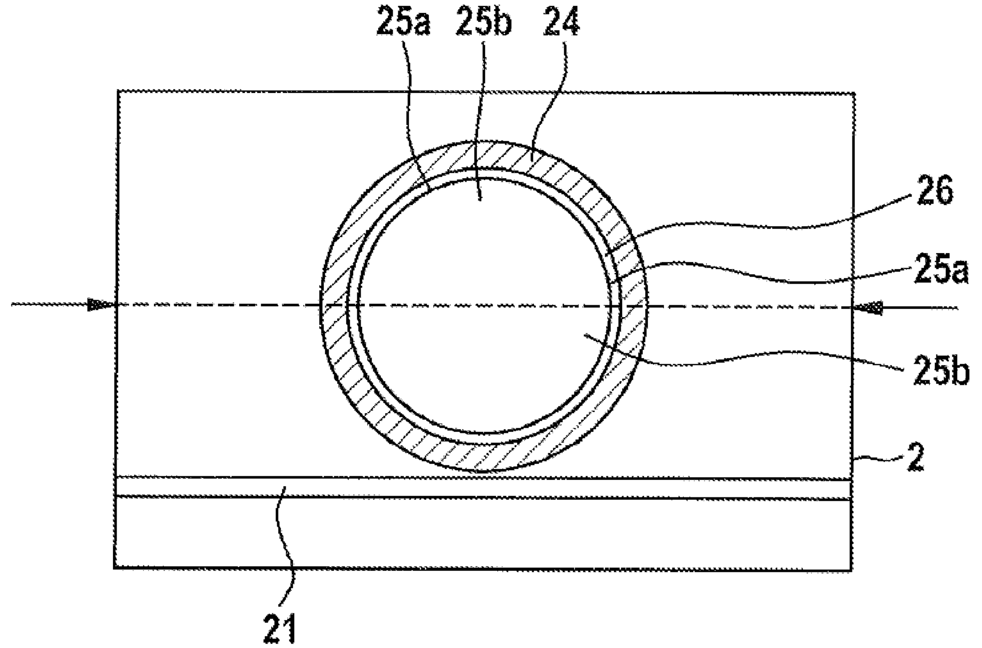
FIGS. 4*a* and 4*b* show a top view and a cross-sectional view of the piezo actuator with an inner piezo actuator structure, respectively.
Figure 4B:
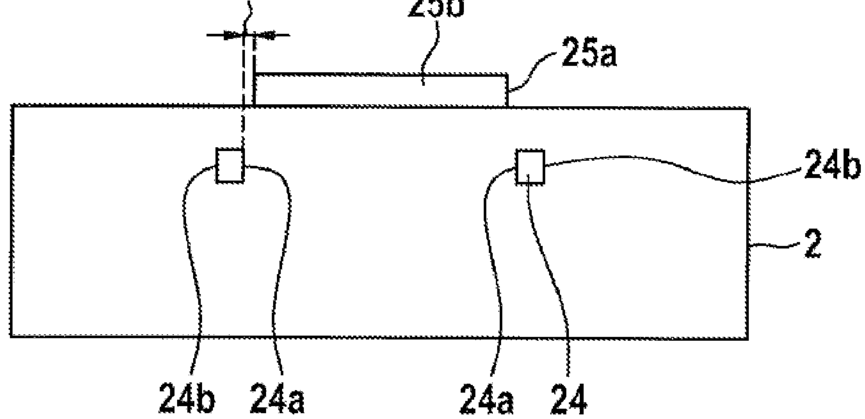

Substantially, as shown in a configuration of FIGS. 4*a* (top view) and 4*b* (cross-sectional view) the piezo actuator 25 can have an inner piezo actuator structure 25*b* be formed with a shape and size of the interior (the plane surrounded by at least a part of the waveguide structure) of the circular resonator 24 (in a top view) having an outer edge 25*a* lying within the interior section of the circular resonator 24. Thereby, when viewed from the top, the gap 26 between an inner edge 24*a* of the circular resonator 24 and the outer edge 25*a* of the piezo actuator 25 can be constant or varying.

Furthermore, when viewed from the top, the outer edge 25*a* of the planar piezo actuator 25 can extend along an inner edge 24*a* of the waveguide structure of the circular resonator 24 with the gap 26. The gap size may be between 0 and 10 μm.

Figure 5A:
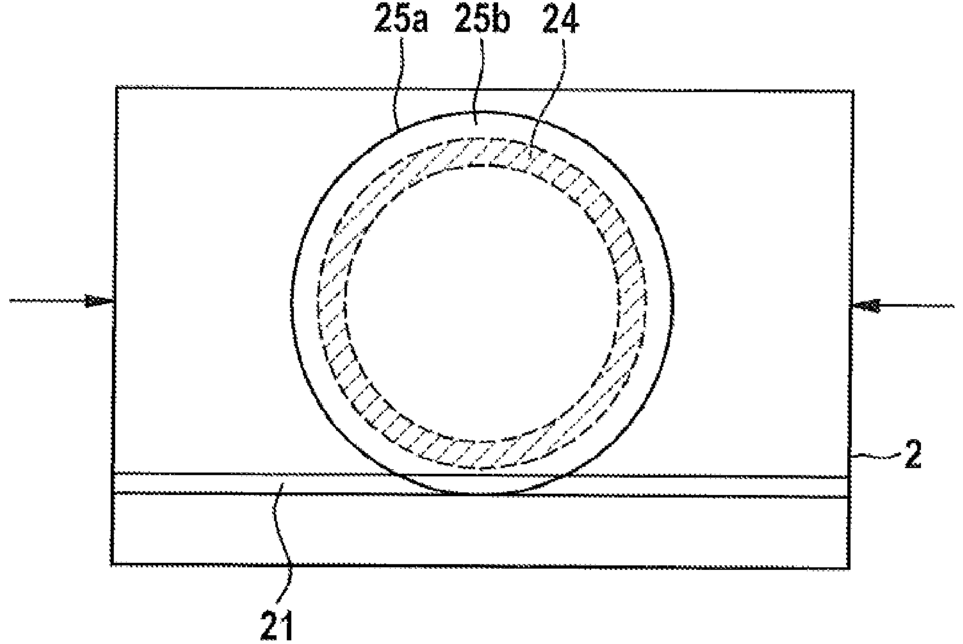
FIGS. 5*a* and 5*b* show a top view and a cross-sectional view of the piezo actuator with an overlapping inner piezo actuator structure, respectively.
Figure 5B:
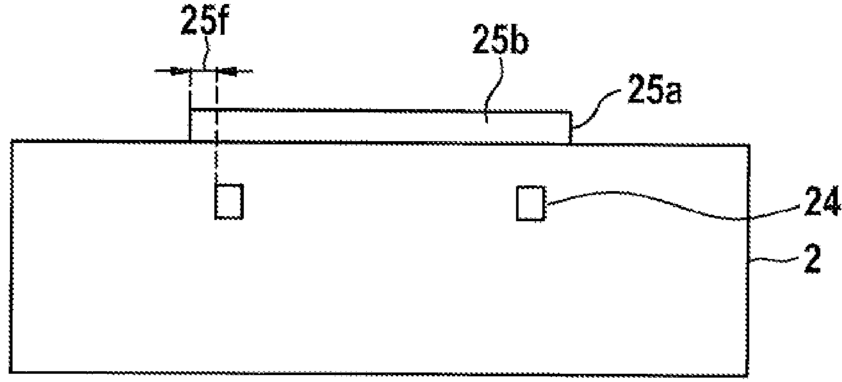

Furthermore, as shown in a configuration of FIGS. 5*a* (top view) and 5*b* (cross-sectional view) the edge 25*a* of the inner piezo actuator structure 25*b* at least partially overlaps the circular resonator 24 waveguide so that the inner piezo actuator structure 25*b* covers the circular resonator 24 at least for an extent of more than 90% of the length/circumference of the circular resonator 24. The overlap 25*f* may extend an outer edge 24*a* of the waveguide structure of the circular resonator 24. The overlap size may be between 0 and 10 μm.

Figure 6A:
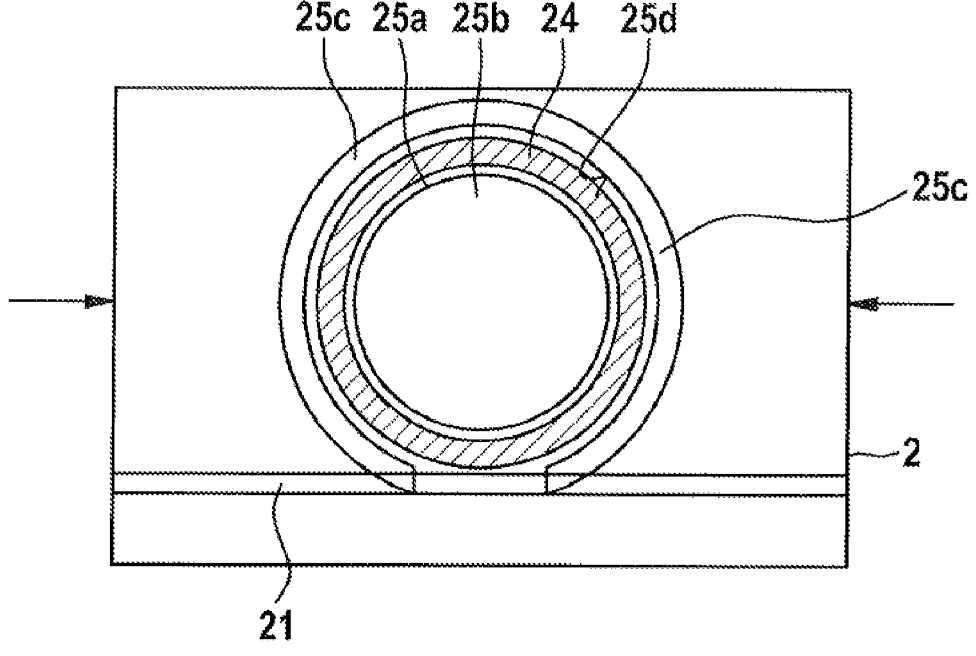
FIGS. 6*a* and 6*b* show a top view and a cross-sectional view of the piezo actuator with an inner and outer piezo actuator structure, respectively.
Figure 6B:
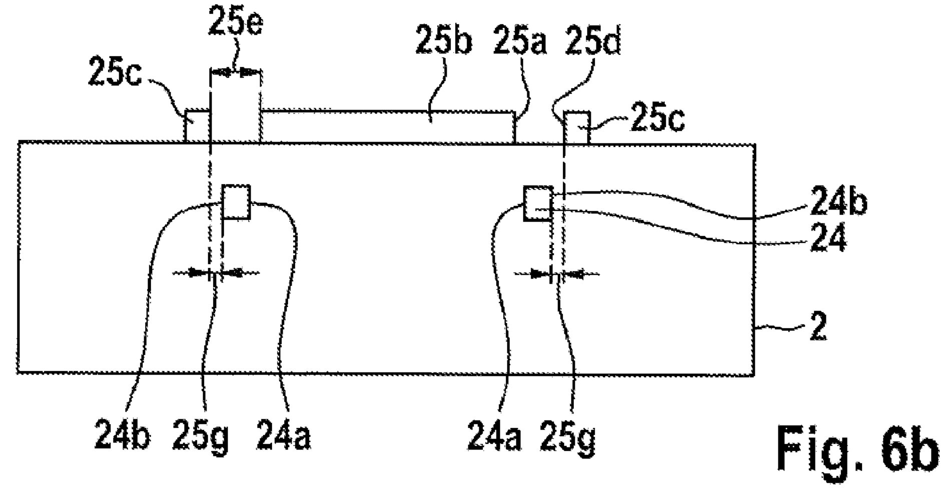

Alternatively, or additionally, as shown in FIGS. 6*a* (top view) and 6*b* (cross-sectional view) an outer piezo actuator structure 25*c* of the piezo actuator 25 can be formed surrounding the inner piezo actuator structure 25*b* wherein an inner edge 25*d* of the outer piezo actuator structure 25*c* may extend along the circular resonator waveguide. The inner edge 25*d* of the outer piezo actuator structure 25*c* may be distanced from the outer edge of the circular resonator waveguide with a gap 25*g* of a varying or an equal width, e.g. by between 0 to 10 μm or may partly or fully overlap the circular resonator waveguide 24.

If both an inner and an outer piezo actuator structure 25*b*, 25*c* of the piezo actuator 25 is provided, a piezo actuator gap 25*e* is formed. This allows a push-pull operation of the inner 25*b* and outer piezo actuator structures 25*c* of the piezo actuator 25 to cancel bulk and/or flexural modes.

Basically, the location of the piezo actuator or the outer and/or inner piezo actuator structures 25*b*, 25*c* and the size and position of the gap 25*e* with relation to the circular resonator 24 may be used to vary a sensitivity of a linear tuning rate (MHz/V) of the circular resonator.

Also, the outer piezo actuator structure 25*c* can be provided without the inner piezo actuator structure 25*b* at least partially forming a band structure surrounding or overlapping or covering the circular resonator 24 when viewed from the top.

The piezo actuator gap 25*e* may extend over the circular resonator 24 waveguide or substantially extend into the interior of the circular resonator 24 or into the outside of the circular resonator 24 (where the inner piezo actuator structure overlaps the circular resonator). The piezo actuator gap 25*e* is basically located close to the resonator waveguide with a distance of the outer or inner edges of the piezo actuator gap 25*e* to an outer or inner edge of the resonator waveguide of not more than 10 μm.

For modulation of the laser light guided in the resonator waveguide, the piezo actuator is driven by an AC control signal. The two piezo actuator structures 25*b* and 25*c* can be operated in phase or in counter phase (by applying a reverse polarity) to efficiently apply a geometric deformation on top of the circular resonator 24 to allow a proper tuning of the resonator device 2.

For tuning, the piezo actuator 25 is operated with an AC control signal AS applied from a tuning unit which may have a triangular waveform or any arbitrary waveform to tune laser component 1. As e.g. shown in FIG. 1 a flattened actuation transfer function is needed to minimize chirping nonlinearity.

Figure 7:
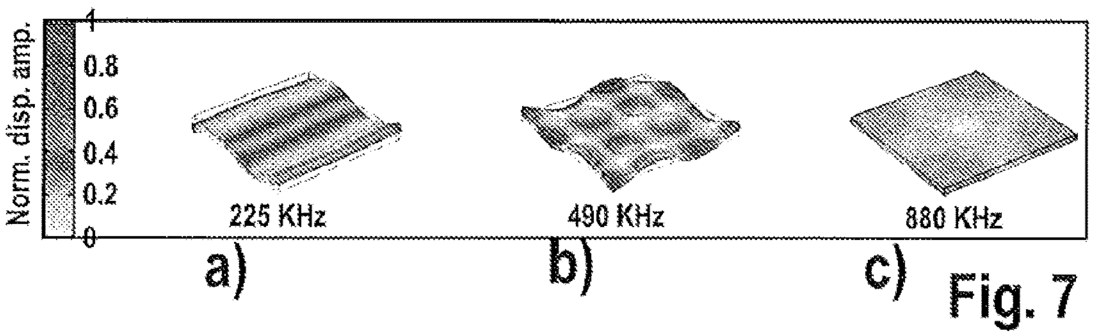
FIGS. 7*a* to 7*c* show different flexural modes on a rectangular resonant device 2.

When driven in an AC operation mode the piezo actuator 25 effects numerous mechanical modes caused by resonance frequencies. As many mechanical modes occur at relatively low resonance frequencies it may interfere with the AC operation of the piezo actuator 25 while tuning and may lead to a substantial chirping nonlinearity which effects the tight frequency locking of the laser component 1. Therefore, mechanical modes which basically occur as flexural modes by transverse standing waves shall be suppressed. FIGS. 7*a* and 7*b* show different flexural modes on a rectangular resonant device 2 while FIG. 7*c* illustrate a bulk mode in the rectangular resonant device 2.

Various mechanical mode suppression means can be applied to the resonator device 2 to enable the suppression of the mechanical modes.

Figure 8:
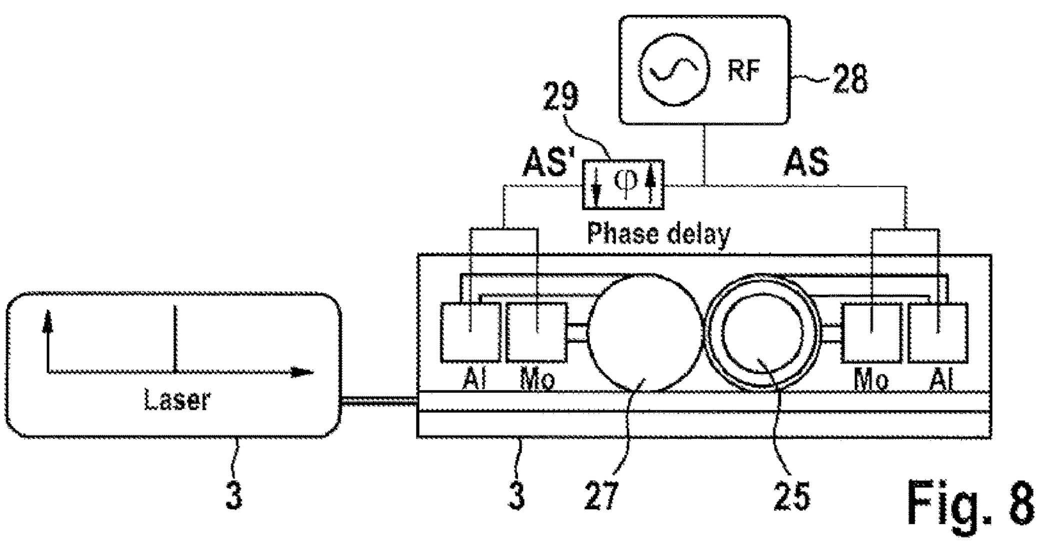
FIG. 8 shows a setup of controlling the piezo actuator structures with a control unit.

As shown in FIG. 8 a dummy piezo actuator 27 may be arranged neighbored to the piezo actuator 25 coupled to the circular resonator 24. Preferably, but not necessarily the dummy piezo actuator 27 has the same geometry and size as the active piezo actuator 25, which may have any of the aforementioned configurations, and is fabricated adjacent to the circular resonator 24 using the same process steps as used for producing the active piezo actuator 25.

The piezo actuator 25 and the dummy piezo actuator 27 may also be arranged each with the inner piezo actuator structure 25*b* and the outer piezo actuator structure 25*c* being distanced by the gap 25*e*, as mentioned above, for a push-pull configuration.

During actuation of the piezo actuator 25 the two piezo actuators 25, 27 are driven concurrently, e.g. with the same frequency and identical amplitude but in counter phase to cancel/compensate the mechanical excitation of the substrate of the photonic resonator device 2. As a result, this stress optical effect exerted on the circular resonator 24 is mainly determined by the active piezo actuator 25. So, the detrimental mechanical resonances in the actuation response of the resonator device 2 can be effectively attenuated or suppressed.

As shown in the setup of FIG. 8 the AC control signal AS of the piezo actuators 25, 27 may be chosen to be equal and in anti-phase fashion. The operating frequency range of the AC control signal may be between 0.01 to 10 MHz. According to FIG. 8, the AC control signal AS may be provided by a radio frequency generator 28 generating a variable AC control signal AS. A variable phase shifter 29 can be provided to apply a phase shift onto the AC control signal AS to obtain a phase-shifted AC control signal AS'. For effective far-field destructive interference of flexural modes, the phases of the active and the dummy piezo actuator 25, 27 can be adjusted using the variable phase-shifter 29. The variable phase-shifter 29 may generate the phase-shifted AC control signal AS' depending on the operating frequency of the AC control signal AS.

The amplitude can be controlled from the radiofrequency generator 28 which should effectively be the same on both the piezo actuators 25, 27. Usage of the radiofrequency generator 28 may cancel flexural modes but will not have any effect on the bulk contour modes.

Figure 9:
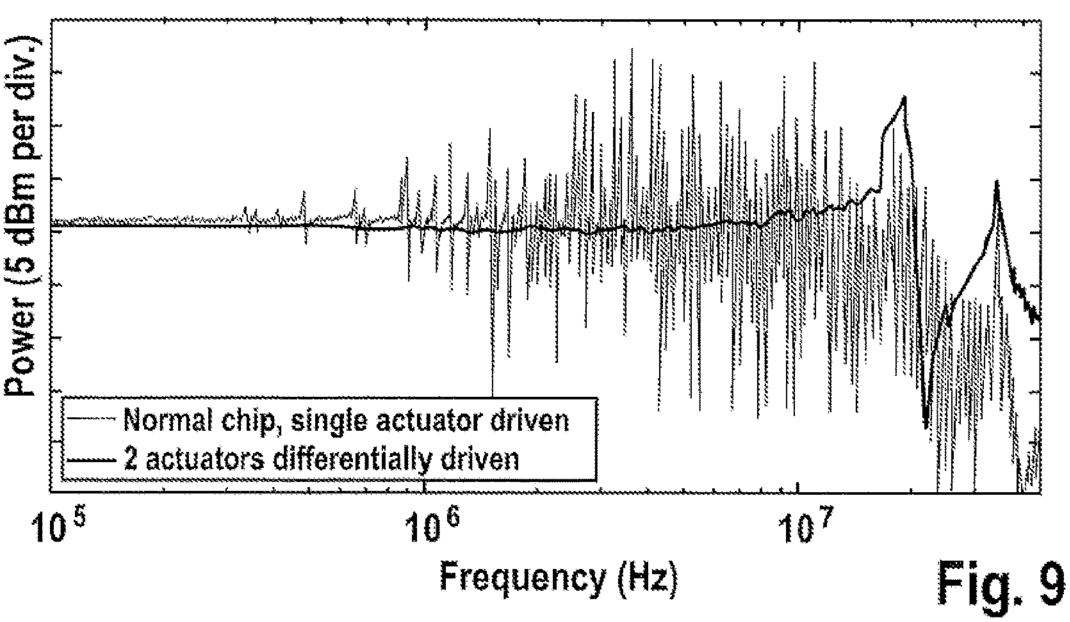
FIG. 9 shows exemplary measured responses of the conventional single piezo actuator configuration and the differential piezo actuation configuration.

In FIG. 9 exemplarily measured mechanical responses of the conventional single piezo actuator configuration (without the dummy piezo actuator) and the differential piezo actuation configuration (with the dummy piezo actuator) are illustrated. It can be clearly seen that the differential actuation configuration (bold line) effectively reduces the amplitudes of the mechanical modes at frequencies below 1 MHz compared to the single piezo actuator configuration (thin line), thereby mainly canceling the flexural modes due to far-field destructive interference.

Figure 10:
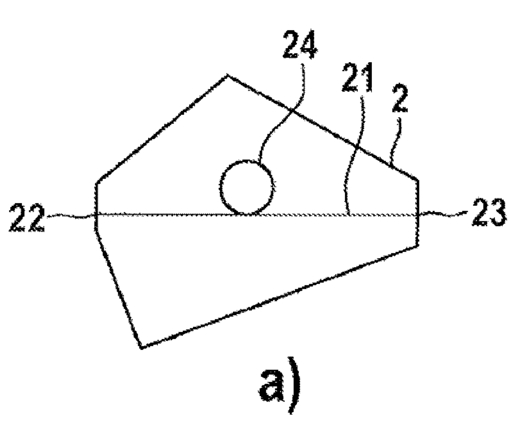
FIGS. 10*a* to 10*b* show examples of different shapes of the photonic resonator substrates.
Figure 10:
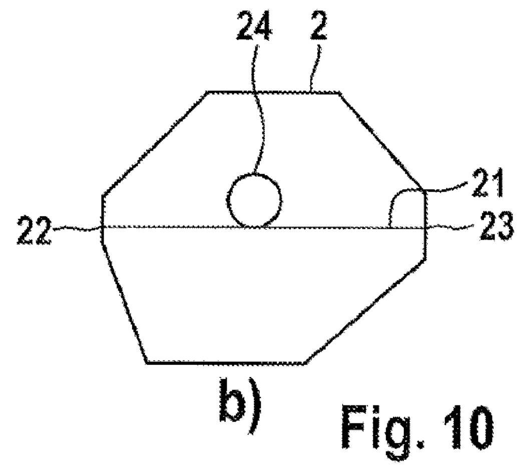

As a further means from mechanical mode suppression the shape of the substrate for the integrated photonic resonator device 2 can be apodized. While flexural modes form numerous mechanical modes of relatively low resonance frequencies by transverse standing waves, bulk mechanical modes whose vibrations are caused by longitudinal standing waves can be eliminated by shaping the geometry of the resonator device substrate. The strength and/or number of bulk mechanical modes can be significantly reduced if the substrate is provided with a non-rectangular shape wherein at least two opposing edges are non-parallel to each other. Basically, each shape with reduced lengths of parallel edges is beneficial. Examples are shown in FIGS. 10*a* to 10*b* wherein different shapes of the photonic resonator substrate are illustrated.

For instance, the substrate may be polygon-shaped with irregular edge lengths. Particularly, the common substrate can be shaped as an irregular polygon to have non-parallel sides.

Such an apodization of the photonic resonator substrate S can be applied to the single piezo actuator configuration and the differential piezo actuation configuration and can result in a substantial reduction of bulk mechanical mode during actuation of the piezo actuator 25.

Further, attenuation of mechanical vibration can be obtained by applying damping means onto the substrate such as attaching a tape or adhere the substrate onto a carrier plate.

Figure 11:
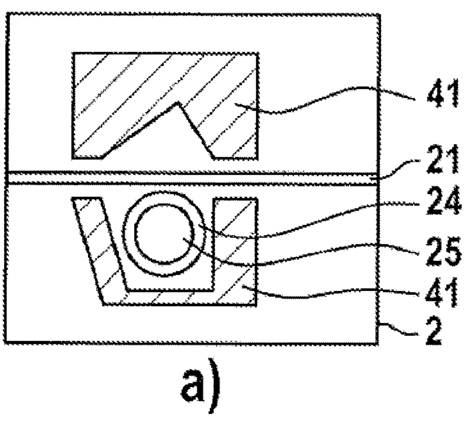
FIGS. 11*a* and 11*b* show examples of structuring of the surface of the photonic resonator device to suppress bulk mechanical modes.
Figure 11:
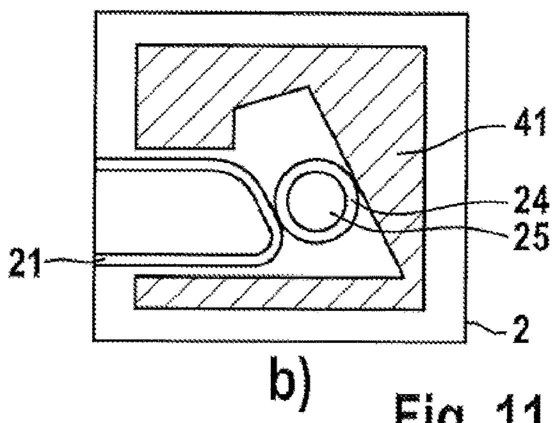
Figure 12:
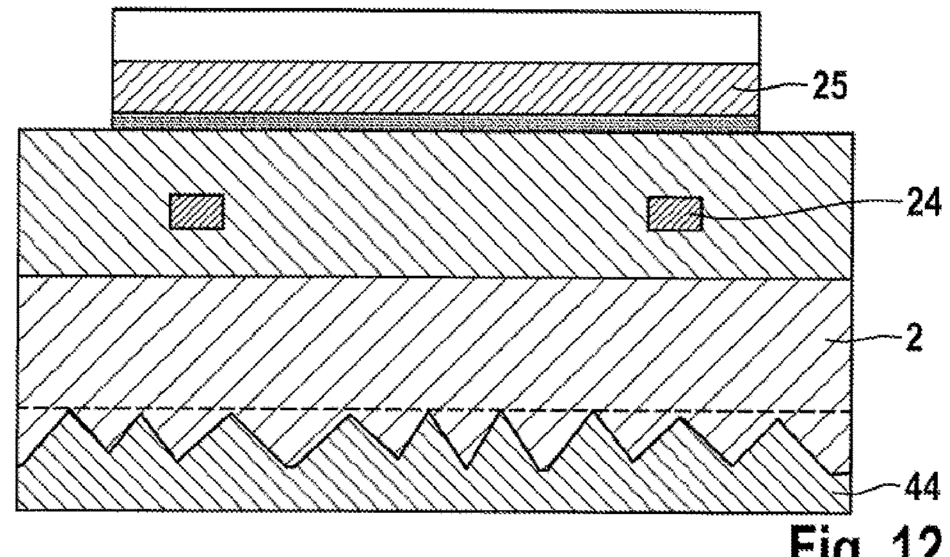
FIG. 12 shows an illustration of a corrugation on a backside of the substrate.

Furthermore, as exemplarily shown in FIGS. 11*a* and 11*b*, a structuring of the surface of the photonic resonator device 2 can further suppress bulk mechanical modes. Recession structures on the front or back surface of the photonic resonator device 2 substrate may help to produce further edges at which mechanical vibrations are reflected and scattered thereby weakening the resonance modes.

As can be seen in the FIGS. 11*a* and 11*b* the mechanical mode suppression structures formed as one or more recessions 41 can basically be randomly arranged around the active structures, e.g. the circular resonator 24, the waveguide 21, and the piezo actuator 25 so that the vibrational coupling of the active structures of the piezo actuator 25 to the rest of the resonator device 2 is substantially reduced. The recessions may be formed with curved or linear edges that are non-parallel to the outer edges of the substrate S. This results in reduced coupling of resonance modes effected outside of the mechanical mode suppression structures back to the active structures. The depth of the recessions 41 may be between 1 and 10%, preferably between 2 and 6%, of the average thickness of the substrate S. Preferably, the sidewalls of the one or more recessions form a sharp edge with the surface of the substrate wherein an angle between the sidewall of the one or more recessions and the surface of the substrate may be between than 60° and 120° preferably between 80° and 100°.

Alternatively, or additionally to the recessions (41), one or more elevations can be correspondingly formed on the surface of the substrate S which also may form inner edges that serve to scatter mechanical vibrations. The height of the elevations may be between 1 and 10%, preferably between 2 and 6%, of the average thickness of the substrate S. Preferably, the sidewalls of the one or more elevations form a sharp edge with the surface of the substrate wherein an angle between the sidewall of the one or more elevations and the surface of the substrate may be between than 60° and 120° preferably between 80° and 100°.

Additionally or alternatively, a corrugation 44 on the backside of the substrate S can be provided. The corrugation 44 is formed at least on the area of the backside facing the resonator waveguide 24. The corrugation has an average depth of between 1 and 10%, preferably between 2 and 6%, of the total thickness of the substrate and an average roughness of between 1 and 10%, preferably between 2 and 6%, of the total thickness of the substrate S. Basically, the corrugation 44 has an aspect ratio between the average roughness and the average depth of between 0.8 and 1.2 preferably between 0.9 and 1.1.

FIGS. 13*a* and 13*b* show two embodiments of a photonic resonator device providing a Vernier filter device 50.

The shown Vernier filter device 50 has a first and a second resonators 241 and 242. The two resonators 241 and 242 are formed with different free spectral ranges FSR which are obtained by applying different optical path lengths wherein the first resonator 241 has a longer optical path length than the second resonator 242.

The first resonator 241 is optically coupled with a waveguide 210. The waveguide has a first optical interface 220 where it may be optically coupled with a reflective semiconductor optical amplifier 51. The reflective semiconductor optical amplifier 51 may have a reflectivity of between 5 and 30%, preferable about 10%.

Also, a delay waveguide 52 is optically coupled with the waveguide 210. The delay waveguide 52 may have a spiral formed part. A first end 521 of the delay waveguide 52 is coupled with the second resonator 242 and a second end 522 may be coupled with the waveguide 210. The delay waveguide 52 may provide an optical path length between their ends which allows to operate in a regime when the switching time is shorter than the photon round trip time.

The first resonator 241 is coupled with the waveguide 210 while the first and second resonators 241, 242 are optically coupled via a short waveguide portion 53.

A first and a second piezo actuators 251 and 252 are placed on top of two resonators 241, 242, respectively, to achieve fast, bi-directional, low hysteresis tuning. This allows to carefully select the lasing wavelength and also paves the way to reconfigure the laser properties by means of an external feedback.

In a second configuration which is shown in FIG. 13*b* the reflectivity of the reflective semiconductor optical amplifier 51 may be between 80 and 98%, preferably 95%, and second end 522 is provided with an interface 230 which offers the opportunity to use output light either directly from the RSOA back facet or from the interface 230. A middle portion 523 is optically coupled with the waveguide 210.

The different embodiments concerning the structure of the piezo actuator and the dummy piezo actuator of the photonic resonator device can be equally applied on the Vernier filter device 50. Furthermore, the mechanical mode suppression means as described in conjunction with the photonic resonator device can be equally applied with the Vernier filter device 50.

The invention claimed is:

1. An electrically tunable photonic resonator device for a laser component, comprising:

at least one optical waveguide with at least one optical interface for coupling in laser light, at least one optical resonator including an optical resonator waveguide being made of an optical resonator material wherein laser light coupled via the at least one optical waveguide is coupled into the at least one optical resonator, at least one piezo actuator to apply mechanical stress at least partially onto the at least one optical resonator, wherein the at least one optical resonator, the at least one piezo actuator and the at least one optical waveguide are monolithically integrated on a common substrate of the electrically tunable photonic resonator device; and a mechanical mode suppression means configured to attenuate one or more mechanical modes of oscillation caused by an alternating current (AC) operation of the at least one piezo actuator;

wherein the at least one optical resonator comprises a closed circuit, the optical resonator waveguide surrounding an inner resonator plane and is coupled to the at least one optical waveguide in a respective coupling region, wherein the at least one piezo actuator covers or excludes the coupling region;

wherein the at least one piezo actuator has an inner piezo actuator structure and an outer piezo actuator structure being distanced by a gap, wherein the gap is one of:

in an interior of the inner resonator plane;

at least partially covering the optical resonator waveguide; or outside of the inner resonator plane.

2. The electrically tunable photonic resonator device according to claim 1, wherein the electrically tunable photonic resonator device is formed by a MEMS process comprising:

providing a silicon substrate with a top layer of silicon dioxide;

forming optical structures of the at least one optical resonator using selective etching and/or deposition of the optical resonator material;

depositing silicon dioxide to bury the optical structures; and applying a piezo material, to form the at least one piezo actuator onto at least a part of the optical structures of the at least one optical resonator.

3. The electrically tunable photonic resonator device according to claim 1, wherein the at least one piezo actuator is formed with a lower electrode layer made of Al or Mo, a piezo material layer formed of AlN, Sr doped AlN, or PZT, and an upper electrode layer of Al or Mo.

4. The electrically tunable photonic resonator device according to claim 1, wherein the at least one optical resonator is made of the resonator material, which has a third order (Kerr) nonlinearity and an anomalous or normal resonator dispersion.

5. The electrically tunable photonic resonator device according to claim 1, wherein the mechanical mode suppression means includes at least one dummy piezo actuator arranged on the substrate of the electrically tunable photonic resonator device laterally displaced to the at least one piezo actuator.

6. The electrically tunable photonic resonator device according to claim 5, wherein the at least one dummy piezo actuator has an identical shape and/or size and/or orientation as the at least one piezo actuator.

7. The electrically tunable photonic resonator device according to claim 5, wherein the at least one dummy piezo actuator arranged on the common substrate has a lateral displacement to the at least one piezo actuator in a direction of one of the lateral edges of the common substrate.

8. The electrically tunable photonic resonator device according to claim 5, wherein a tuning unit is provided on the common substrate or separate thereof, wherein the tuning unit is configured to drive the at least one piezo actuator and the dummy piezo actuator in an out of phase manner.

9. The electrically tunable photonic resonator device according to claim 8, wherein the tuning unit is configured to drive the at least one piezo actuator and the dummy piezo actuator in a counterphase manner.

10. The electrically tunable photonic resonator device according to claim 1, wherein the mechanical mode suppression means includes an apodization of the common substrate, wherein the common substrate has at least two edges which are non-parallel to each other.

11. The electrically tunable photonic resonator device according to claim 10, wherein the common substrate has no parallel edges.

12. The electrically tunable photonic resonator device according to claim 1, wherein the mechanical mode suppression means include sizing of the common substrate so that a first eigen frequency of flexural modes is above 1 MHz and the first eigen frequency of bulk modes is above 3 MHz.

13. The electrically tunable photonic resonator device according to claim 12, wherein at least one dimension of the common substrate particularly is below 2 mm.

14. The electrically tunable photonic resonator device according to claim 1, wherein the mechanical mode suppression means include providing one or more additional structures on the common substrate which provide a mechanical oscillation attenuation of bulk and/or flexural modes.

15. The electrically tunable photonic resonator device according to claim 14, wherein the mechanical mode suppression means include one or more recessions on one surface of the common substrate and/or one or more elevations on one surface of the common substrate.

16. The electrically tunable photonic resonator device according to claim 14, wherein the one or more additional structures comprises at least one corrugation on a backside of the common substrate.

17. A laser component, comprising:

a laser device being arranged for providing laser light; and the electrically tunable photonic resonator device according to claim 1, wherein the laser device is coupled with the optical resonator waveguide of the electrically tunable photonic resonator device to allow laser light being transmitted between the laser device and the electrically tunable photonic resonator device to enable a self-injection-locking operation of the laser component.

18. The laser component according to claim 17, wherein a tuning unit is configured to provide a variable driving current for the laser device and a variable actuator driving AC voltage for the at least one piezo actuator to allow tuning of the laser component.

19. A method comprising using the laser component of claim 17 in a FMCW Lidar application.

20. The electrically tunable photonic resonator device according to claim 1, formed as a Vernier filter device, comprising:

the at least one optical waveguide with at least an optical interface for coupling in laser light;

the at least one optical resonator comprising a first optical resonator including a first optical resonator waveguide being made of the optical resonator material, wherein laser light coupled via the at least one optical resonator waveguide is coupled into the first optical resonator;

the at least one optical resonator comprising a second optical resonator including a second optical resonator waveguide being made of the optical resonator material, wherein the first and second optical resonators are optically coupled via an optical resonator waveguide portion, wherein the first and the second optical resonators have different free spectral ranges;

wherein the at least one piezo actuator comprises a first piezo actuator and a second piezo actuator to apply mechanical stress at least partially onto the first and second optical resonators;

a delay waveguide optically coupling the at least one optical waveguide with the second optical resonator;

wherein the first and second optical resonators, the first and second piezo actuators and the at least one optical waveguide and the delay waveguide are monolithically integrated on a common substrate of the photonic resonator device; and the mechanical mode suppression means configured to attenuate one or more mechanical modes of oscillation caused by the AC operation of the at least one piezo actuator.

21. The electrically tunable photonic resonator device according to claim 1, wherein the optical resonator material is $Si_3N_4$.

22. An electrically tunable photonic resonator device for a laser component, comprising:

at least one optical waveguide with at least one optical interface for coupling in laser light, at least one optical resonator including an optical resonator waveguide being made of an optical resonator material, wherein laser light coupled via the at least one optical waveguide is coupled into the at least one optical resonator, at least one piezo actuator to apply mechanical stress at least partially onto the at least one optical resonator, wherein the at least one optical resonator, the at least one piezo actuator and the at least one optical waveguide are monolithically integrated on a common substrate of the electrically tunable photonic resonator device; and a mechanical mode suppression means configured to attenuate one or more mechanical modes of oscillation caused by an alternating current (AC) operation of the at least one piezo actuator;

wherein the mechanical mode suppression means includes at least one dummy piezo actuator arranged on the substrate of the electrically tunable photonic resonator device laterally displaced to the piezo actuator; and wherein a tuning unit is provided on the common substrate or separate thereof and the tuning unit is configured to drive the at least one piezo actuator and the dummy piezo actuator in an out of phase manner.

* * * * *